(12) United States Patent
Shim (10) Patent No.: US 7,888,211 B2
(45) Date of Patent: Feb. 15, 2011

(54) METHOD OF MANUFACTURING FLASH MEMORY DEVICE

(75) Inventor: Cheon-Man Shim, Yeongdeungpo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/544,761

(22) Filed: Aug. 20, 2009

(65) Prior Publication Data

US 2010/0159660 A1 Jun. 24, 2010

(30) Foreign Application Priority Data

Dec. 24, 2008 (KR) .................. 10-2008-0133681

(51) Int. Cl.
*H01L 21/336* (2006.01)
(52) U.S. Cl. .............. 438/267; 438/287; 257/E21.679
(58) Field of Classification Search .......... 438/287, 438/257, 266, 267
See application file for complete search history.

(56) References Cited

U.S. PATENT DOCUMENTS 7,300,833 B2 * 11/2007 Yamamoto et al. .......... 438/197

2007/0221960 A1 * 9/2007 Ashida ...................... 257/213

FOREIGN PATENT DOCUMENTS

KR 10-2006-0103153 9/2006

* cited by examiner

*Primary Examiner*—Charles D Garber
*Assistant Examiner*—Reema Patel
(74) *Attorney, Agent, or Firm*—Sherr & Vaughn, PLLC (57) ABSTRACT

A method of manufacturing a flash memory device includes preparing a semiconductor substrate comprising a cell area and a peripheral area, forming a first well and an oxide-nitride-oxide (ONO) layer in the cell area, forming a second well in the peripheral area of the semiconductor substrate comprising the first well and forming a first oxide layer in the peripheral area, forming a first polysilicon layer over the ONO layer and the first oxide layer and performing a first etch process to form a memory gate comprising an ONO layer pattern and a first polysilicon pattern in the cell area, forming a second oxide layer pattern and a second polysilicon pattern over either sidewall of the memory gate and forming a gate in the peripheral area, performing a third etch process so that the second oxide layer pattern and the second polysilicon pattern remain over only the one sidewall of the memory gate to form a select gate, and forming a first impurity area in the semiconductor substrate between the memory gates adjacent to each other.

16 Claims, 7 Drawing Sheets

METHOD OF MANUFACTURING FLASH MEMORY DEVICE

The present application claims priority under 35 U.S.C. 119 to Korean Patent Application No. 10-2008-0133681 (filed on Dec. 24, 2008), which is hereby incorporated by reference in its entirety.

BACKGROUND

A flash memory device is a type of non-volatile memory, which maintains stored data even when its power is turned off. It has an advantage in that data processing speed in write, read and delete operations is comparatively high.

Accordingly, flash memory devices are widely used as data storage devices for the BIOS of a personal computer (PC), set-top boxes, printers and a network servers. Flash memory has frequently employed in cameras, cellular phones, and etc., in recent years.

In flash memory devices, a semiconductor device using a silicon-oxide-nitride-oxide-silicon (SONOS) structure is being used, and the SONOS-type memory device may have a variety of masks for forming patterns.

SUMMARY

Embodiments relate to a method of manufacturing a flash memory device. In embodiments, a method of manufacturing a flash memory device may include preparing a semiconductor substrate including a cell area and a peripheral area; forming a first well in the cell area of the semiconductor substrate and forming an oxide-nitride-oxide layer over the cell area of the semiconductor substrate; forming a second well in the peripheral area of the semiconductor substrate and forming a first oxide layer over the peripheral area of the semiconductor substrate; forming a first polysilicon layer over the oxide-nitride-oxide layer and the first oxide layer and performing a first etch process to form a memory gate including an oxide-nitride-oxide layer pattern and a first polysilicon pattern in the cell area; forming a second oxide layer pattern and a second polysilicon pattern over a first sidewall of the memory gate and forming a gate in the peripheral area; performing a third etch process on the semiconductor substrate so that the second oxide layer pattern and the second polysilicon pattern remain over only the first sidewall of the memory gate to form a select gate; and forming a first impurity area in the semiconductor substrate between the memory gates adjacent to each other.

In embodiments, a method of manufacturing a flash memory device may include: preparing a semiconductor substrate including a cell area and a peripheral area; forming a first well in the cell area of the semiconductor substrate and a second well in the peripheral area; forming a memory gate comprising an oxide-nitride-oxide layer pattern and a first polysilicon pattern over the cell area of the semiconductor substrate; forming a first oxide layer and a second polysilicon layer over the semiconductor substrate including the memory gate; forming a second oxide layer pattern and a second polysilicon pattern over a first sidewall of the memory gate, and simultaneously, forming a gate in the peripheral area; performing a first etch process on the semiconductor substrate so that the second oxide layer pattern and the second polysilicon pattern remain over only the first sidewall of the memory gate to form a select gate; and forming a first impurity area in the semiconductor substrate between the memory gates adjacent to each other.

DRAWINGS

Example

Example

DESCRIPTION

Example FIGS. 1 to 14 are plane views and sectional views of a flash memory device according to embodiments. Table 1 below shows photo steps illustrating a process sequence of a flash memory device according to embodiments.

TABLE 1

| Logic area | Photo step # | Cell area (HV-MV Full share) |
|---|---|---|
| AA(DUV/OPC/PSM) | S1 | AA(DUV/OPC/PSM) |
| | S2 | DNW |
| | S3 | Cell PW + Vt |
| | S4 | ONO |
| PWA | S5 | PWA |
| PWB | S6 | PWB(Share with HV) |
| NWA | S7 | NWA |
| NWB | S8 | NWB(Share with HV) |
| LA(gate oxide) | S9 | LA(gate oxide) |
| | S10 | Memory Gate Poly etch-back |
| | S11 | Spacer Poly etch |
| GC(DUV/OPC/PSM) | S12 | GC(DUV/OPC/PSM) |
| | S13 | Cell Source IMP |
| LN | S14 | LN |
| LNH | S15 | LNH(Share with HV) |
| LP | S16 | LP |
| LPH | S17 | LPH(Share with HV) |
| XP | S18 | XP |
| XN | S19 | XN |
| NSAL | S20 | NSAL |
| Cont~M3 + Passivation | S21~S27 | Cont~M3 + Passivation |
| 20 Mask | TOTAL | 27 Mask |

Figure 1:
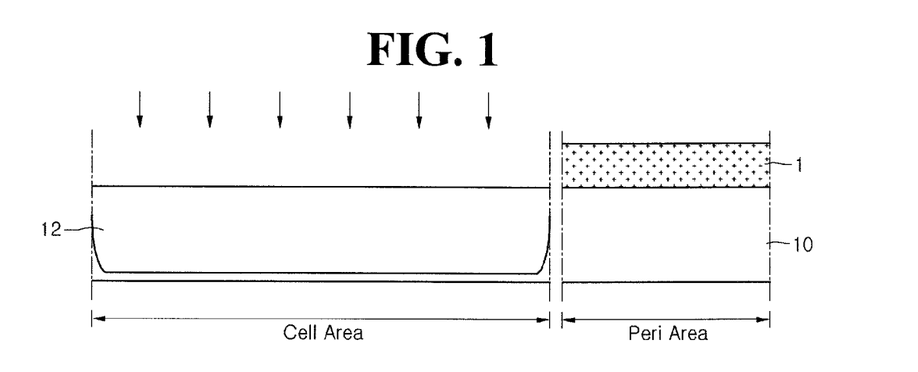
FIGS. 1 to 14 are plane views and sectional views of a flash memory device according to embodiments.

Referring to example FIG. 1, a device isolation layer may be formed on a semiconductor substrate 10 including a cell area and a peripheral area to form an active area (S1), and then, to form a first impurity area 12 in a cell area (S2).

A first photoresist pattern 1 may be formed over the semiconductor substrate 10 to cover only the peripheral area, and a first ion implantation process may be performed to form the first impurity area 12. The first impurity area 12 may be a well. After the first impurity area 12 is formed, an ion implantation process for adjusting a threshold voltage of a memory gate may be additionally performed.

Figure 2:
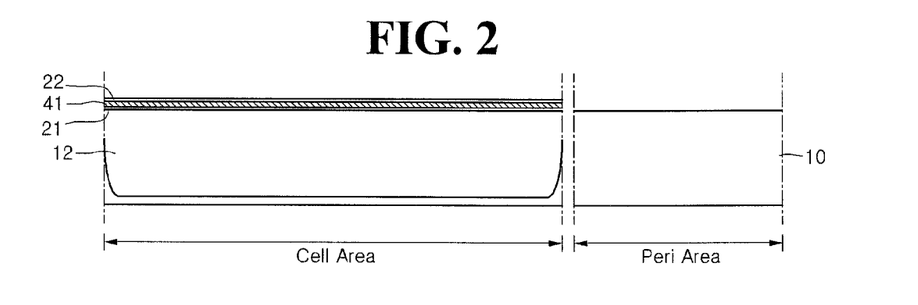

Referring to example FIG. 2, an oxide-nitride-oxide (ONO) layer including a first oxide layer 21, a first nitride layer 41, and a second oxide layer 22 may be formed in the cell region of the semiconductor substrate 10. A first oxide layer, a first nitride layer, and a second oxide layer may be sequentially stacked over the semiconductor substrate 10, and the ONO layer formed in the peripheral area may be removed to form the first oxide layer 21, the first nitride layer 41, and the second oxide layer 22. Here, the first oxide layer 21, the first nitride layer 41, and the second oxide layer 22 may cover the entire active area of the cell area.

The first oxide layer 21 and the second oxide layer 22 may be formed of $SiO_2$ having a dielectric constant k of about 4.0 or one of high-k materials, having a dielectric constant k greater than about 4.0, such as $HfO_2$, $ZrO_2$, and $HfSi_xO_y$ (where x and y are natural numbers). The first nitride layer 41 serving as a charge trap layer later may be replaced with a metal nano-crystal or a nano-crystal such as Ge or Si.

Figure 3:
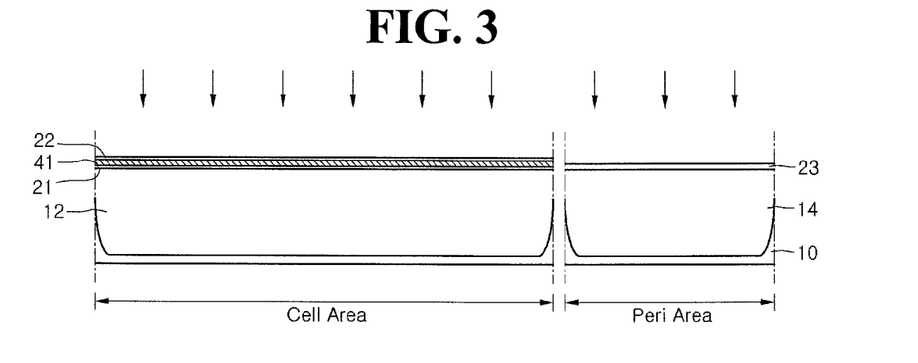

Referring to example FIG. 3, a second ion implantation process may be performed on the semiconductor substrate 10 to form a second impurity area 14 (S5 through S8). Here, the second ion implantation process may be performed in all of the cell and peripheral areas. The second ion implantation process may be performed using a variety of masks. This is done because ion implantation concentrations and kinds of ions are different according to voltage levels used in the gates. Thus, the proper ions and concentrations may be implanted into each of the gates using the masks.

The second impurity area 14 may be a well. Although not shown, when the second ion implantation process is performed, a well in which a high voltage gate is to be formed may be formed at the same time. A third oxide layer 23 may be formed over the peripheral area of the semiconductor substrate 10 including the second impurity area 14 (S9).

Figure 4:
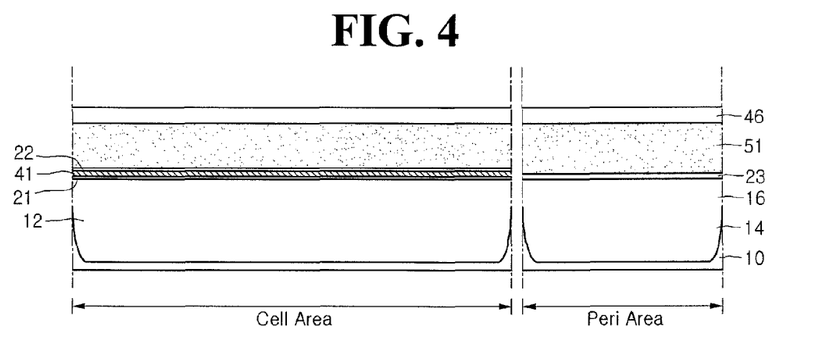

Referring to example FIG. 4, a first polysilicon layer 51 and a hard mask layer 46 may be formed over the third oxide layer 23 and the second oxide layer 22 in the cell area and the peripheral area (S10). Referring to example FIG. 5, a second photoresist pattern 2 may be formed over the hard mask layer 46. A first etch process may be performed using the second photoresist pattern 2 as a mask to form a first oxide layer pattern 25, a first nitride layer pattern 43, a second oxide layer pattern 26, a first polysilicon pattern 61, and a hard mask pattern 47.

Figure 5:
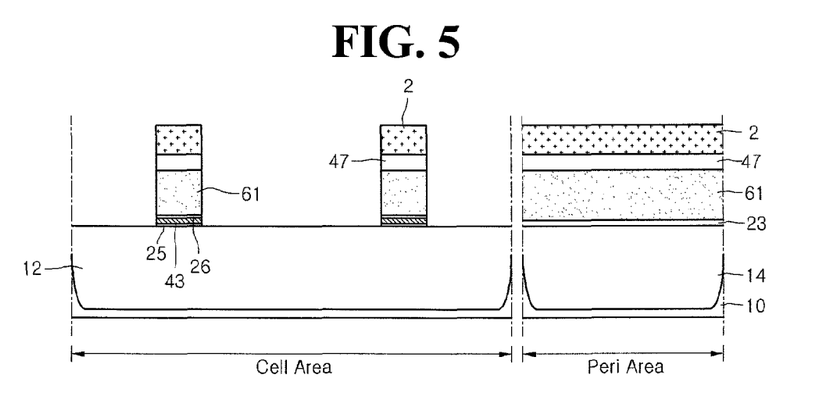

Here, the peripheral area may be covered by the second photoresist pattern 2. Thus, only the first polysilicon layer 51 and the hard mask layer 46 of the cell area are patterned, and the first polysilicon layer 51 and the hard mask layer 46 of the peripheral area may remain as they are (S10). The hard mask layer 46 may include an oxide layer or a nitride layer, but it is not limited thereto. For example, the hard mask layer 46 may be formed of materials that may be used as a mask when the polysilicon layer is etched.

Figure 6:
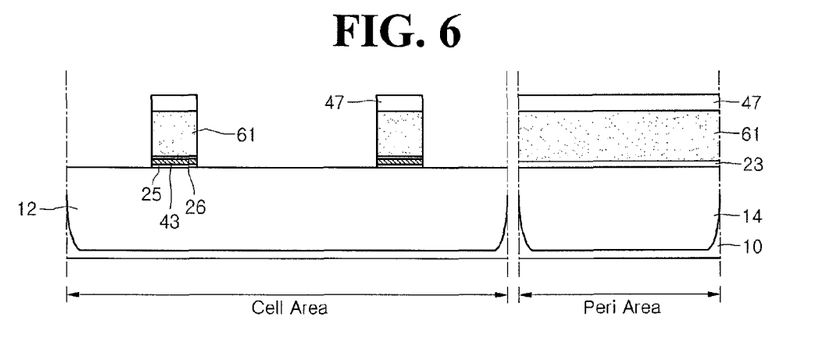

Referring to example FIG. 6, the second photoresist pattern 2 may be removed. Here, the first polysilicon pattern 61 may be a memory gate. The first oxide layer pattern 25, the first nitride layer pattern 43, and the second oxide layer pattern 26 may be disposed below the first polysilicon pattern 61 to form a silicon-oxide-nitride-oxide-silicon (SONOS) structure.

Figure 7:
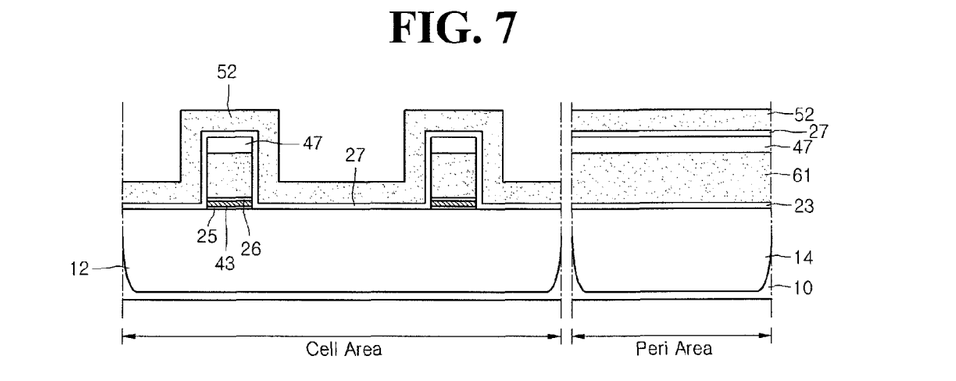
Figure 8:
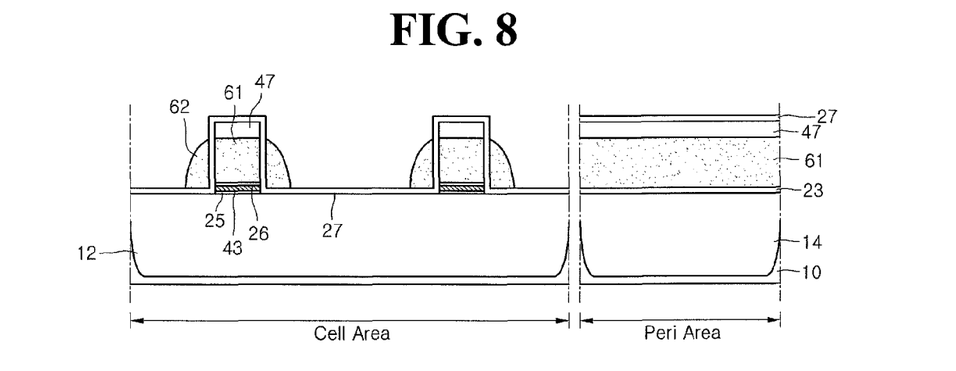

Referring to example FIG. 7, a fourth oxide layer 27 and a second polysilicon layer 52 may be formed over the semiconductor substrate 10. Referring to example FIG. 8, a second etch process may be performed on the semiconductor substrate 10 to form a second polysilicon pattern 62 over either sidewall of the first polysilicon pattern 61 and the fourth oxide layer 27 (S11). Here, the second polysilicon layer 52 formed in the peripheral area may be completely removed.

Figure 9:
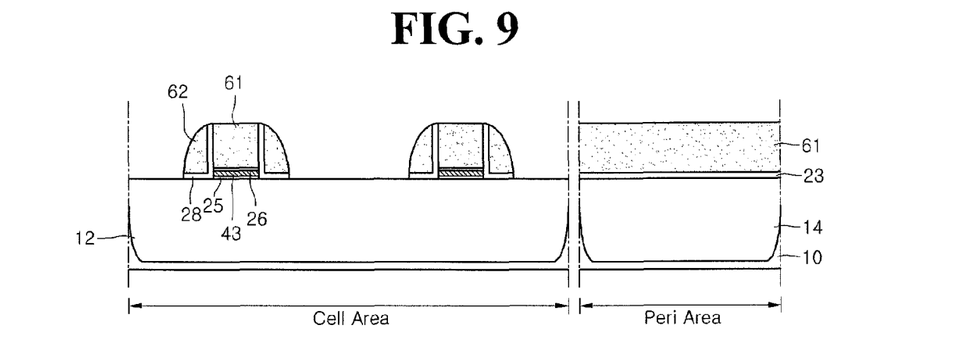

Referring to example FIG. 9, a third etch process may be performed on the semiconductor substrate 10 to form a fourth oxide layer pattern 28 between the first polysilicon pattern 61 and the second polysilicon pattern 62 and between the semiconductor substrate 10 and the second polysilicon pattern 62. Here, the fourth oxide layer 27 and the hard mask pattern 47 formed in the peripheral area may be completely removed. Also, the hard mask pattern 47 formed over the first polysilicon pattern 61 may be removed.

Figure 10:
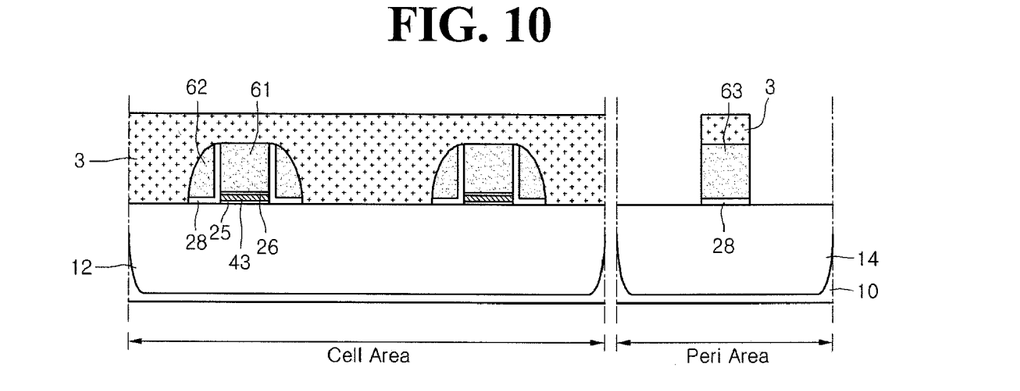

Referring to example FIG. 10, third photoresist pattern 3 may be formed over the semiconductor substrate 10. A fourth etch process may be performed to form a fifth oxide layer pattern 28 and a third polysilicon pattern 63 in the peripheral area of the semiconductor substrate 10 (S12). The cell area may be covered by the third photoresist pattern 3, and a third oxide layer 23 and the first polysilicon pattern 61 formed in the peripheral area may be etched to form the fifth oxide layer pattern 28 and the third polysilicon pattern 63. The fifth oxide layer pattern 28 and the third polysilicon pattern 63 may be formed in the peripheral area to serve as a gate.

Figure 11:
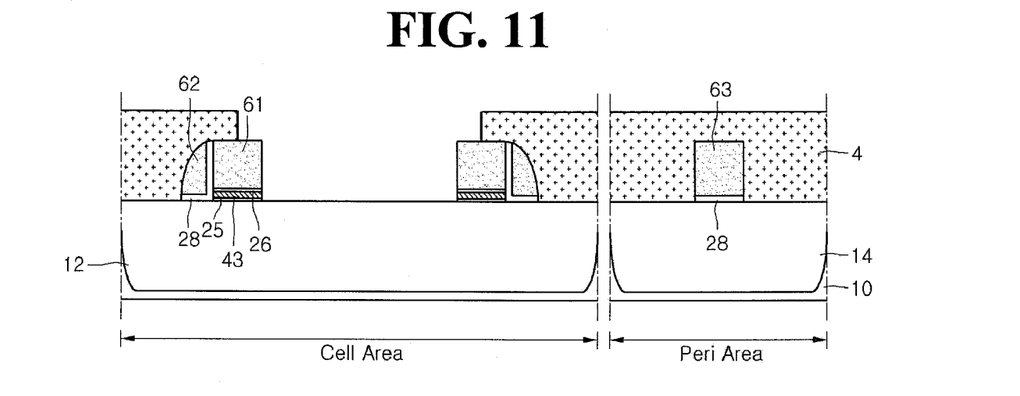

Referring to example FIG. 11, a fourth photoresist pattern 4 may be formed over the semiconductor substrate 10. A fifth etch process is performed to remove the fourth oxide layer pattern 28 and the second polysilicon pattern 62 disposed between the first polysilicon patterns 61 adjacent to each other in the cell area. The fourth photoresist pattern 4 opens only an area, in which a common source line is to be formed, between the first polysilicon patterns 61 adjacent to each other, to remove the fourth oxide layer pattern 28 and the second polysilicon pattern 62 formed between the first polysilicon patterns 61 adjacent to each other.

Thus, the fourth oxide layer pattern 28 and the second polysilicon pattern 62 may be formed over only one sidewall of the sidewalls of the first oxide layer pattern 25, the first oxide layer pattern 43, the second oxide layer pattern 26, and the first polysilicon pattern 61. The second polysilicon pattern 62 formed over the one sidewall of the first polysilicon pattern 61 may be a select gate. Here, although the fifth oxide layer pattern 28 and the third polysilicon pattern 63 may be formed in the peripheral area, and then, the fourth oxide layer pattern 28 and the second polysilicon pattern 62 formed between the first polysilicon patterns 61 adjacent to each other may be removed, but the process sequence may be changed.

That is, the fourth oxide layer pattern 28 and the second polysilicon pattern 62 formed between the first polysilicon pattern 61 may be removed, and then, the fifth oxide layer pattern 28 and the third polysilicon pattern 63 may be formed in the peripheral area.

Figure 12:
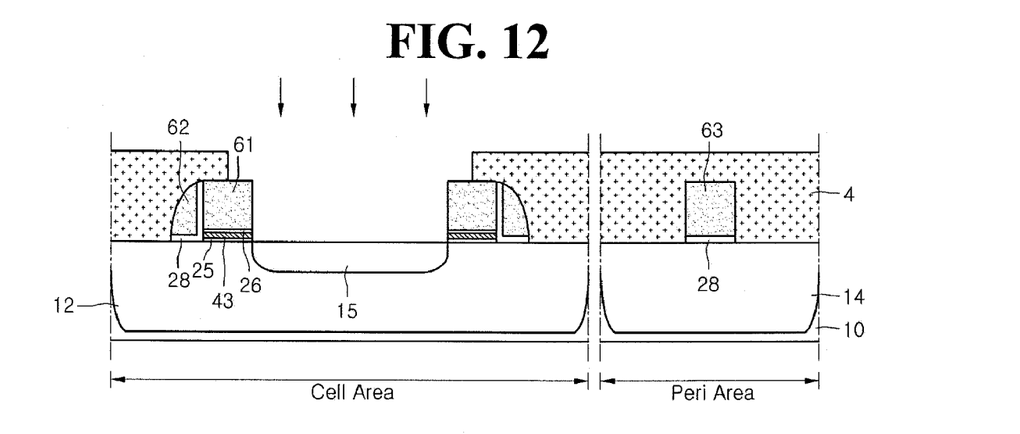

Referring to example FIG. 12, a third ion implantation process may be performed on the semiconductor substrate 10 using the fourth photoresist pattern 4 as a mask to form a third impurity area 15 between the first polysilicon patterns 61 adjacent to each other of the semiconductor substrate 10 (S13). The third impurity area 15 may be a source area.

Figure 13:
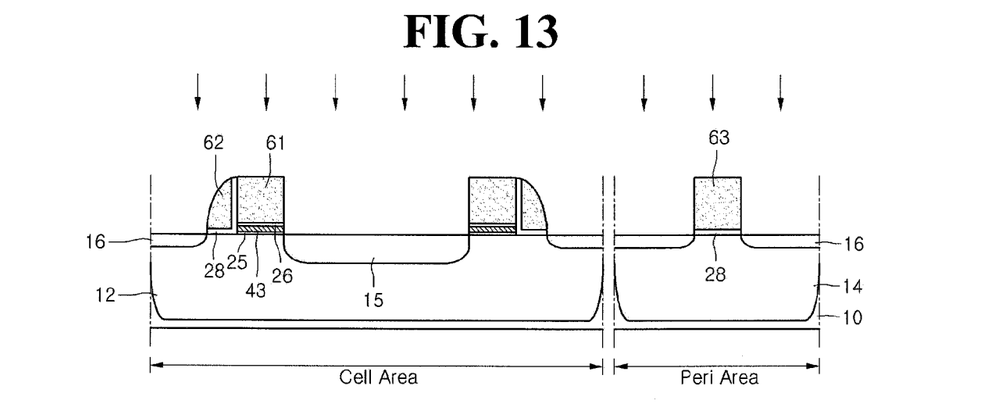

Referring to example FIG. 13, a fourth ion implantation process may be performed on the semiconductor substrate 10 to form a fourth impurity area 16. The fourth impurity area may be simultaneously formed in the cell area and the peripheral area. The fourth impurity area may be a lightly doped drain (LDD) area.

Figure 14:
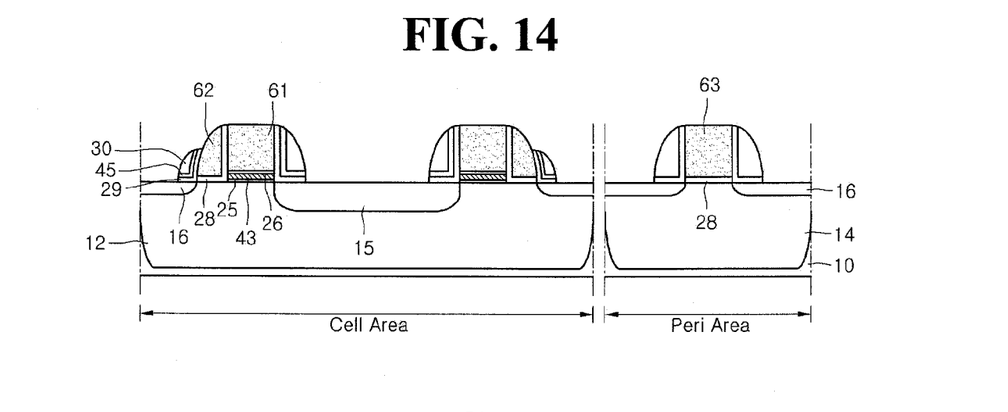

Referring to example FIG. 14, a spacer may be formed over either sidewall of the first polysilicon pattern 61, the second polysilicon pattern 62, and the third polysilicon pattern 63. An oxide layer, a nitride layer, and an oxide layer may be sequentially stacked over the semiconductor substrate 10, and a sixth etch process may be performed to form a sixth oxide layer pattern 29, a second nitride layer pattern 45, and a seventh oxide layer pattern 30, to thereby form the spacer.

Since the first polysilicon pattern 61 and the second polysilicon pattern 62 contact each other, with the fourth oxide layer pattern 28 interposed therebetween, the spacer may be formed over the sidewall of the second polysilicon pattern 62 with which the first polysilicon pattern 61 does not contact. Although the spacer has an oxide-nitride-oxide (ONO) structure in embodiments, the present disclosure is not limited thereto. For example, the spacer may have an oxide-nitride (ON) structure.

Figure 15:
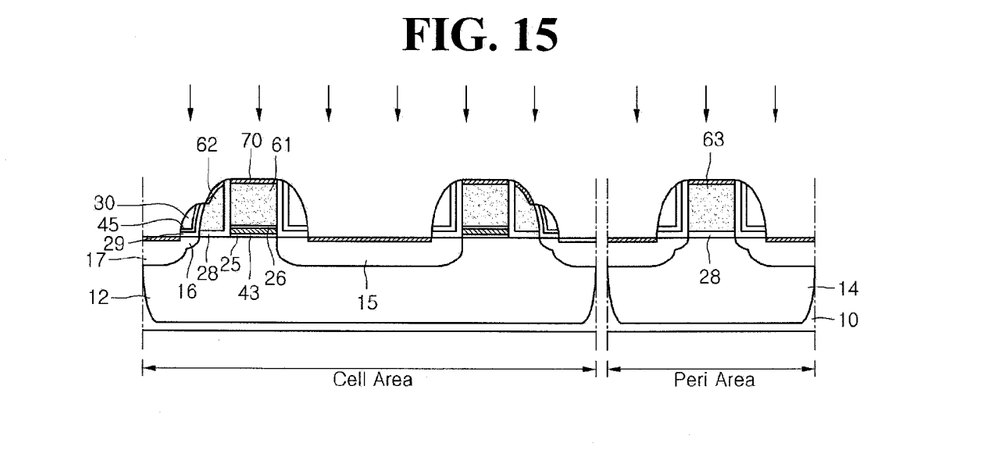
FIGS. 15 to 21 are plane views and sectional views of a flash memory device according to embodiments.

Referring to example FIG. 15, a fifth ion implantation process may be performed on the semiconductor substrate 10 to form a fifth impurity area 17 (S14 through S19). The fifth impurity area 17 may be a drain area in the cell area and a source or drain area in the peripheral area. The fifth ion implantation process may be performed using a variety of masks. This is done because n-type impurity ions or p-type impurity ions are selectively implanted according to gates. Thus, the proper ions may be implanted into each of gates using the masks.

A silicide layer 70 may be formed over each of exposed portions of the first polysilicon pattern 61, the second polysilicon pattern 62, the third polysilicon pattern 63, the third impurity area 15, and the fifth impurity area 17 (S20). A silicide process may be performed over the semiconductor substrate 10 using materials such as titanium (Ti), cobalt (Co), and nickel (Ni) to form the silicide layer 70. The silicide layer 70 may be formed in an area in which a contact is to be formed later.

Figure 16:
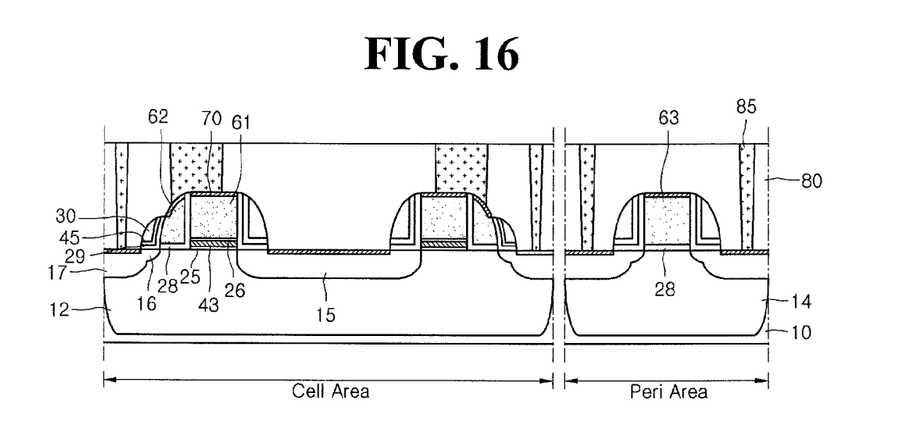

Referring to example FIG. 16, an interlayer dielectric 80 may be formed over the semiconductor substrate 10, and contacts 85 may be formed in the interlayer dielectric 80 (S21). The contact 80 connected to the first polysilicon pattern 61 and the second polysilicon pattern 62 may be formed in one body such that the contact 80 is simultaneously connected to the first polysilicon pattern 61 and the second polysilicon pattern 62.

A nitride layer may be additionally formed over the semiconductor substrate 10, and then, the interlayer dielectric 80 may be formed. Also, an interconnection forming process may be performed over the interlayer dielectric 80 including the contacts.

Example FIGS. 15 to 21 are plane views and sectional views of a flash memory device according to embodiments. Table 2 below shows photo steps illustrating a process sequence of a flash memory device according to embodiments.

TABLE 2

| Logic area | Photo step # | Cell area (HV-MV Full share) |
|---|---|---|
| AA(DUV/OPC/PSM) | S1 | AA(DUV/OPC/PSM) |
|  | S2 | DNW |
| PWA | S3 | PWA |
| PWB | S4 | PWB(Share with HV) |
| NWA | S5 | NWA |
| NWB | S6 | PWB(Share with HV) |
|  | S7 | ONO and 1st poly dep |
|  | S8 | Memory Gate |
| LA(gate oxide) | S9 | LA(gate oxide) |
|  |  | Poly etch-back |
|  | S10 | Spacer Poly etch |
| GC(DUV/OPC/PSM) | S11 | GC(DUV/OPC/PSM) |
|  | S12 | Cell Source IMP |
| LN | S13 | LN |
| LNH | S14 | LNH(Share with HV) |
| LP | S15 | LP |
| LPH | S16 | LPH(Share with HV) |
| XP | S17 | XP |
| XN | S18 | XN |
| NSAL | S19 | NSAL |
| Cont~M3 + Passivation | S20~S26 | Cont~M3 + Passivation |
| 21 Mask | TOTAL | 26 Mask |

Figure 17:
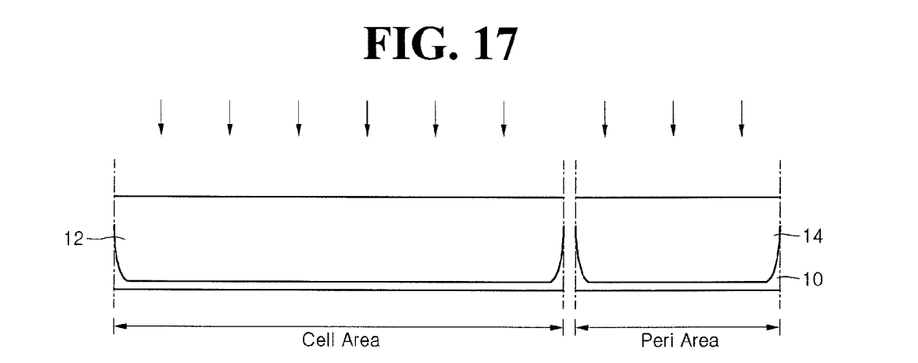

Referring to example FIG. 17, a device isolation layer may be formed on a semiconductor substrate 10 including a cell area and a peripheral area to define an active area (S1). A first ion implantation process may be performed on the semiconductor substrate 10 to form a first impurity area 12 in the cell area and a second impurity area 14 in the peripheral area (S2 through S6).

Here, the first ion implantation process may be performed using a variety of masks. This may be done because ion implantation concentrations and kinds of ions are different according to voltage levels used in the gates. Thus, the proper ions and concentrations may be implanted into each of the gates using the masks. The first impurity area 12 and the second impurity area 14 may be wells, respectively.

When the first ion implantation process is performed, a well in which a high voltage gate is to be formed may be formed at the same time. Also, when the first ion implantation process for forming the first impurity area 12 and the second impurity area 14 is performed, an ion implantation process for adjusting a threshold voltage of a memory gate may be additionally performed. Here, since a mask used for forming the first impurity area 12 and the second impurity area 14 may be simultaneously used in the ion implantation process for the adjusting the threshold voltage, the number of masks may be reduced.

Figure 18:
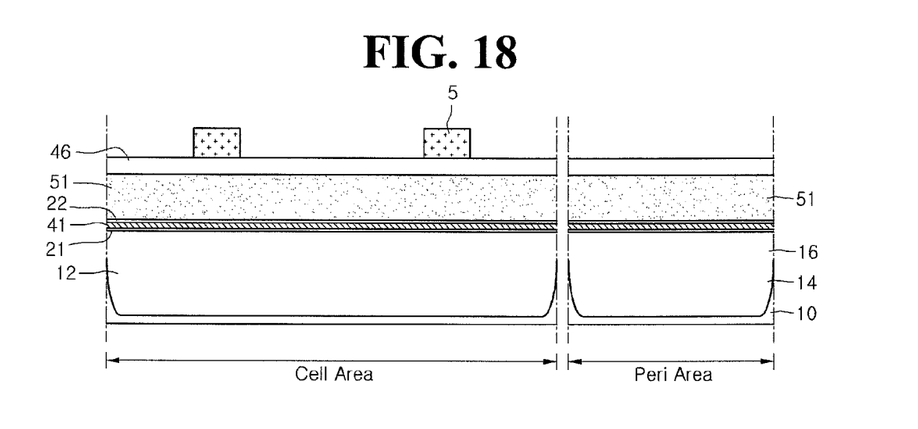

Referring to example FIG. 18, an oxide-nitride-oxide layer including a first oxide layer 21, a first nitride layer 41, and a second oxide layer 22, a first polysilicon layer 51, and a hard mask layer 46 may be formed over the semiconductor substrate 10 including the first impurity area 12 and the second impurity area 14 (S7). A fifth photoresist pattern 5 may be formed over the hard mask layer 46. The first oxide layer 21, the first nitride layer 41, the second oxide layer 22, the first polysilicon layer 51, and the hard mask layer 46 may be formed over all of the cell and peripheral areas.

Referring to example FIG. 9, a seventh etch process may be performed using fifth photoresist pattern 5 as a mask to form a first oxide layer pattern 25, a first nitride layer pattern 43, a second oxide layer pattern 26, a first polysilicon pattern 61, and a hard mask pattern 47 over only the cell area of the semiconductor substrate 10 (S8). Here, the first oxide layer 21, the first nitride layer 41, the second oxide layer 22, the first polysilicon layer 51, and the hard mask layer 46, which may be formed in the peripheral area, may be completely removed by the seventh etch process.

Figure 19:
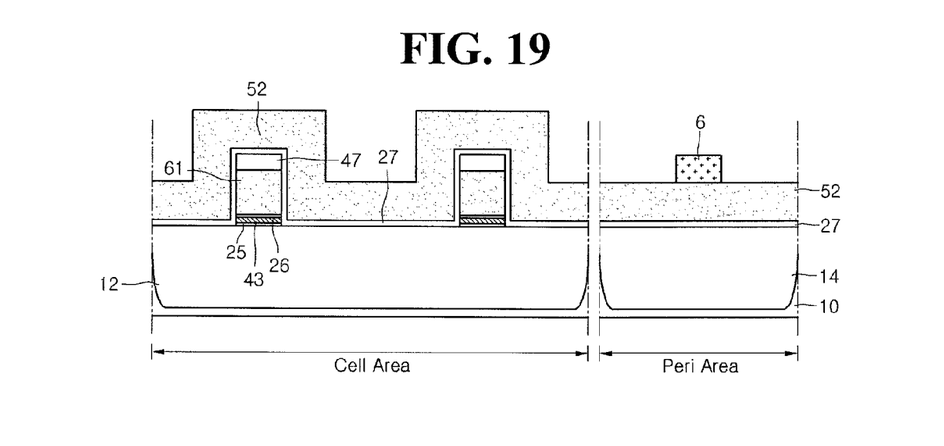

A fourth oxide layer 27 and a second polysilicon layer 52 are formed in the cell area including the first oxide layer pattern 25, the first nitride layer pattern 43, the second oxide layer pattern 26, the first polysilicon pattern 61, and the hard mask pattern 47 and the peripheral area of the semiconductor substrate 10.

Figure 20:
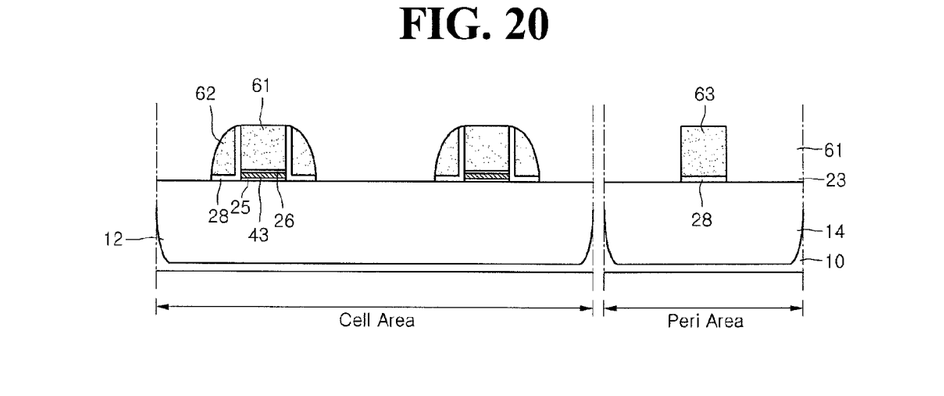

Referring to example FIG. 20, a fourth oxide layer pattern 28 and a second polysilicon pattern 62 may be formed over sidewalls of the first polysilicon pattern 61 formed in the cell area, and the fourth oxide layer pattern 28 and third polysilicon pattern 63 may be formed in the peripheral area (S9 and S10). Here, a sixth photoresist pattern 6 may be formed over the second polysilicon layer 52 of the peripheral area, and an eighth etch process may be performed on the semiconductor substrate 10 to form the fourth oxide layer pattern 28, the second polysilicon pattern 62, and the third polysilicon pattern 63. When the eighth etch process is performed, the hard mask pattern 47 may be removed at the same time.

Figure 21:
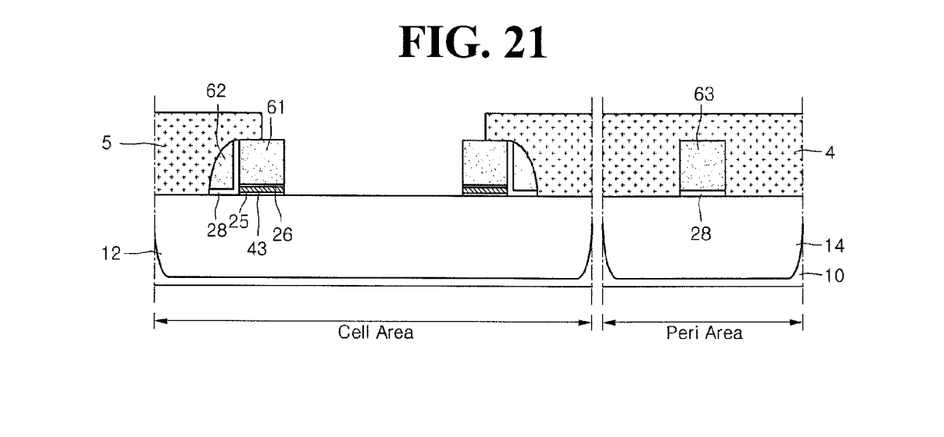

Referring to example FIG. 21, a fourth photoresist pattern 4 may be formed over the semiconductor substrate 10, and the fourth oxide layer pattern 28 and the second polysilicon pattern 62 disposed between the first polysilicon patterns 61 adjacent to each other in the cell area may be removed. Here, the fourth photoresist pattern 4 opens only an area, in which a common source line is to be formed, between the first polysilicon patterns 61 adjacent to each other, to remove the fourth oxide layer pattern 28 and the second polysilicon pattern 62 formed between the first polysilicon patterns 61 adjacent to each other. Thus, the fourth oxide layer pattern 28 and the second polysilicon pattern 62 may be formed over only one sidewall of the sidewalls of the first oxide layer pattern 25, the first oxide layer pattern 43, the second oxide layer pattern 26, and the first polysilicon pattern 61. The second polysilicon pattern 62 formed over the one sidewall of the first polysilicon pattern 61 may be a select gate.

The following processes may be performed using the same process as example FIG. 12 below of the previously described embodiments. That is, in the method of manufacturing the flash memory device according to embodiments, when the walls of the cell area and the peripheral area are formed, the ion implantation process for adjusting the threshold voltage may be performed at the same time to simplify the photomasking process.

Also, when the ONO layer below the memory gate is formed, the ONO layer formed in the peripheral area is not removed. That is, the ONO layer formed in the peripheral area may be removed at the same time when the etch process for forming the polysilicon pattern that may be the memory gates is performed. Therefore, the number of masks may be reduced.

Table 3 below shows operation conditions of the memory device according to the embodiments.

TABLE 3

|  |  |  | PROGRAM | ERASE | READ |
|---|---|---|---|---|---|
| Method |  |  | Channel Hot Electron | BTBT Induced Hot Hole | Reverse |
| Oper. Mode |  |  | Bit | Sector | Random Access |
| Selected |  | W/L | +HV_P1 | −HV_E1 | Vcc |
|  |  | S/L | +HV_P2 | +HV_E2 | 0 V |
|  |  | B/L | Back bias | Floating | Vd_read |
|  |  | Bulk | 0 V | 0 V | 0 V |
| Unselected | Same W/L | W/L | +HV_P1 | −HV_E1 | Vcc |
|  |  | S/L | +HV_P2 | Floating | 0 V |
|  |  | B/L | Floating | Floating | 0 V |
|  |  | Bulk | 0 V | 0 V | 0 V |
|  | Same B/L | W/L | 0 V | 0 V | 0 V |
|  |  | S/L | +HV_P2 | 0 V | 0 V |
|  |  | B/L | Back bias | Floating | Vd_read |
|  |  | Bulk | 0 V | 0 V | 0 V |

As shown in Table 3, the program operation may be implemented by the Channel Hot Electron (CHE) method, and the erase operation may be implemented by the band-to-band-tunneling (BTBT) induced hot hole method. Also, the read operation may be implemented by a reverse method.

In the operation mode, the program operation may be executed by a bit unit, the erase operation may be executed by a sector unit, and the read operation may be provided in the random access mode. Among the items listed in Table 3, the back bias voltage may be applied to control current.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
preparing a semiconductor substrate including a cell area and a peripheral area;
forming a device isolation layer in the semiconductor substrate;
forming a first well in the cell area of the semiconductor substrate and forming an oxide-nitride-oxide layer over the cell area of the semiconductor substrate having the device isolation layer;
forming a second well in the peripheral area of the semiconductor substrate and forming a first oxide layer over the peripheral area of the semiconductor substrate;
forming a first polysilicon layer over the oxide-nitride-oxide layer and the first oxide layer and performing a first etch process to form a memory gate including an oxide-nitride-oxide layer pattern and a first polysilicon pattern in the cell area;
forming a second oxide layer pattern and a second polysilicon pattern over a first sidewall of the memory gate and forming a gate in the peripheral area;
performing a third etch process on the semiconductor substrate so that the second oxide layer pattern and the second polysilicon pattern remain over only the first sidewall of the memory gate to form a select gate; and
forming a first impurity area being a source area in the semiconductor substrate between the memory gates adjacent to each other using a photoresist pattern used in the third etch process.

2. The method of claim 1, wherein, when the first etch process is performed, the first oxide layer remains over the semiconductor substrate including the peripheral area.

3. The method of claim 2, wherein, when the first etch process is performed, the first polysilicon layer remains over the semiconductor substrate including the peripheral area.

4. The method of claim 3, wherein the gate formed in the peripheral area is formed by performing a second etch process over the first oxide layer and the first polysilicon layer.

5. The method of claim 4, wherein the gate formed in the peripheral area includes a third oxide layer pattern and a third polysilicon pattern.

6. The method of claim 1, wherein the performing of the third etch process includes removing the second oxide layer pattern and the second polysilicon pattern formed between the memory gates adjacent to each other so that the second oxide layer pattern and the second polysilicon pattern remain over only the first sidewall of the memory gate.

7. The method of claim 1, further including performing an ion implantation process on an entire surface of the semiconductor substrate including the first impurity area to form a second impurity area on the semiconductor substrate including the second oxide layer pattern and the second polysilicon pattern of the memory gate and the gate in the peripheral area.

8. The method of claim 1, further including forming spacers over the sidewall of the memory gate and a sidewall of the gate in the peripheral area.

9. The method of claim 8, further including forming an interlayer dielectric over the semiconductor substrate including the spacers.

10. The method of claim 9, including forming contacts in the interlayer dielectric.

11. The method of claim 9, wherein the contact connected to the memory gate is simultaneously connected to the first polysilicon pattern and the second polysilicon pattern.

12. A method comprising:
preparing a semiconductor substrate including a cell area and a peripheral area;
forming a device isolation layer in the semiconductor substrate;
forming a first well in the cell area of the semiconductor substrate and a second well in the peripheral area;
forming a memory gate comprising an oxide-nitride-oxide layer pattern and a first polysilicon pattern over the cell area of the semiconductor substrate;
forming a first oxide layer and a second polysilicon layer over the semiconductor substrate including the memory gate;

forming a second oxide layer pattern and a second polysilicon pattern over a first sidewall of the memory gate, and simultaneously, forming a gate in the peripheral area;

performing a first etch process on the semiconductor substrate so that the second oxide layer pattern and the second polysilicon pattern remain over only the first sidewall of the memory gate to form a select gate; and forming a first impurity area being a source area in the semiconductor substrate between the memory gates adjacent to each other, wherein the forming of the memory gate including the oxide-nitride-oxide layer pattern and the first polysilicon pattern over the semiconductor substrate including the cell area includes:

forming an oxide-nitride-oxide layer over the semiconductor substrate including the cell area and the peripheral area;

forming a first polysilicon layer over the semiconductor substrate including the cell area and the peripheral area; and performing a second etch process on the oxide-nitride-oxide layer and the first polysilicon layer to form the memory gate including the oxide-nitride-oxide layer pattern and the first polysilicon pattern, and wherein, when the second etch process for forming the memory gate is performed, the oxide-nitride-oxide layer and the first polysilicon layer formed in the peripheral area are completely removed.

13. The method of claim 12, wherein the gate formed in the peripheral area is formed by performing a third etch process on the first oxide layer and the second polysilicon layer.

14. The method of claim 12, wherein the performing of the first etch process includes removing the second oxide layer pattern and the second polysilicon pattern formed between the memory gates adjacent to each other so that the second oxide layer pattern and the second polysilicon pattern remain over only the first sidewall of the memory gate.

15. The method of claim 12, further including performing an ion implantation process on an entire surface of the semiconductor substrate comprising the first impurity area to form a second impurity area over the semiconductor substrate including the second oxide layer pattern and the second polysilicon pattern of the memory gate and the gate of the semiconductor substrate.

16. The method of claim 12, further including forming spacers over a sidewall of the memory gate and a sidewall of the gate in the peripheral area.

* * * * *